United States Patent
Tsai

(10) Patent No.: US 8,151,144 B2
(45) Date of Patent: Apr. 3, 2012

(54) MEMORY CARD, NONVOLATILE MEMORY, CONTROLLER, AND METHOD FOR MANAGING WRITING ERRORS FOR NONVOLATILE MEMORIES

(75) Inventor: Jung-Chuan Tsai, Hsinchu (TW)

(73) Assignee: Silicon Motion, Inc., Jhubei (TW)

( * ) Notice: Subject to any disclaimer, the term of this patent is extended or adjusted under 35 U.S.C. 154(b) by 98 days.

(21) Appl. No.: 12/618,766

(22) Filed: Nov. 15, 2009

(65) Prior Publication Data

US 2010/0318840 A1 Dec. 16, 2010

(30) Foreign Application Priority Data

Jun. 10, 2009 (TW) ................................ 98119341 A

(51) Int. Cl.
*G06F 11/00* (2006.01)
(52) U.S. Cl. ........................................................ 714/42
(58) Field of Classification Search .................. None
See application file for complete search history.

(56) References Cited

U.S. PATENT DOCUMENTS

| 7,624,298 B2 * | 11/2009 | Kasahara et al. | 714/5.1 |
| 7,873,778 B2 * | 1/2011 | Choi et al. | 711/103 |
| 2008/0175065 A1 * | 7/2008 | Choi et al. | 365/185.22 |

FOREIGN PATENT DOCUMENTS

CN 101004664 A 7/2007

\* cited by examiner

*Primary Examiner* — Michael Maskulinski
(74) *Attorney, Agent, or Firm* — Wang Law Firm, Inc.; Li K. Wang

(57) ABSTRACT

The invention provides a method for managing writing errors for a nonvolatile memory. In one embodiment, the nonvolatile memory is coupled to a controller. First, data received from the controller is stored in a data register of the nonvolatile memory. The data stored in the data register is then written to a first memory space with a first write address according to instructions from the controller. The data stored in the data register is kept from being changed after the data is written to the first write address. When an error occurs in writing of the data to the first memory space, a rewrite command is sent from the controller to the nonvolatile memory. After the nonvolatile memory receives the rewrite command, the data stored in the data register is written to a second memory space with a second write address according to the rewrite command.

10 Claims, 9 Drawing Sheets

| Rewrite method / Programming mode | Data buffer size Conventional method | Sending a rewrite command | Sending a read-back command |
|---|---|---|---|
| Basic programming mode | 1 page | 1 page | 1 page |
| 2-plane programming mode | 2 page | 1 page | 1 page |
| 2-way-interleave programming mode | 4 page | 1 page | 1 page |
| 2-plane + 2-way-interleave programming mode | 8 page | 1 page | 1 page |

FIG. 9A

| Rewrite method | Conventional method | Sending a rewrite command | Sending a read-back command |
|---|---|---|---|
| Required time period (clock cycle) | X+N+3 | X+3 | (X+N+3)×2 |

FIG. 9B

MEMORY CARD, NONVOLATILE MEMORY, CONTROLLER, AND METHOD FOR MANAGING WRITING ERRORS FOR NONVOLATILE MEMORIES

CROSS REFERENCE TO RELATED APPLICATIONS

This Application claims priority of Taiwan Patent Application No. 98119341, filed on Jun. 10, 2009, the entirety of which is incorporated by reference herein.

BACKGROUND OF THE INVENTION

1. Field of the Invention

The invention relates to nonvolatile memories, and more particularly to flash memories.

2. Description of the Related Art

Nonvolatile memories are memories which keep data stored therein when powers supplied to the memories are switched off. A flash memory is a nonvolatile memory and is used as a memory card or a universal serial bus (USB) device to store data for a computer or a portable electronic device. Data can be electrically programmed into or removed from a flash memory. A flash memory is generally used as a data storage device for a personal digital assistant (PDA), a notebook, a digital music player, a digital camera, or a cell phone.

When a host wants to store data to a nonvolatile memory, a controller of the nonvolatile memory intervenes between the host and the nonvolatile memory to implement requests of the host. Referring to FIG. 1, a block diagram of a memory device 100 comprising a nonvolatile memory 104 is shown. In addition to the nonvolatile memory 104, the memory device 100 also comprises a controller 102. The controller 102 is coupled to a host, and manages data stored in the nonvolatile memory 104 according instructions from the host. In one embodiment, the controller 102 comprises a control unit 112, a data buffer 114, a host interface 116, and a storage interface 118. The host interface 116 is for data communication between the host and the controller 102. The storage interface 118 is for data communication between the controller 102 and the nonvolatile memory 104. The nonvolatile memory stores data according to instructions from the controller 102. In one embodiment, the nonvolatile memory 104 comprises a storage interface 126, a data register 124, and a memory cell array 122. The storage interface 126 is for data communications between the controller 102 and the nonvolatile memory 104. The memory cell array 122 is for data storage.

When the host requests the controller 102 to store data to the nonvolatile memory 104, the controller 102 performs write operations according to instructions from the host. Referring to FIG. 2, a flowchart of a method 200 for writing data to the nonvolatile memory 104 shown in FIG. 1 is shown. First, the controller 102 receives data to be written to the nonvolatile memory 104 from the host via the host interface 116. The data is then stored in the data buffer 114 (step 202). The control unit 112 then sends a write command to the nonvolatile memory 104 via the storage interface 118 (step 204). The control unit 112 then sends a write address to the nonvolatile memory 104 via the storage interface 118 (step 206). The control unit 112 then sends the data stored in the data buffer 114 to the nonvolatile memory 104 via the storage interface 118, and the nonvolatile memory 104 stores the data received from the controller 102 in the data register 124 (step 208).

The nonvolatile memory 104 then writes the data stored in the data register 124 to a memory space with the write address in the memory cell array 122 according to the write command (step 209). The control unit 112 then sends a status check command to the nonvolatile memory 104 via the storage interface 118 (step 210). If an error occurs when the nonvolatile memory 104 writes the data to the memory space, the nonvolatile memory 104 then reports the error to the controller 102. If the nonvolatile memory 104 reports a write error to the controller 102, the controller 102 repeats the steps 204~210 until the nonvolatile memory 104 reports that there were no errors to the controller 102 has occurred (step 212). In other words, when the nonvolatile memory 104 reports a write error to the controller 102, the controller 102 must resend a write command (step 204), a new write address (step 206), and the data (step 208) to the nonvolatile memory 104, and the nonvolatile memory 104 will write the data to a memory space with the new write address in the memory cell array 122 (step 209). The write operation is completed if the nonvolatile memory 104 reports that there were no errors after the nonvolatile memory 104 received a status check command (step 210). A data write process is completed if the host does not send new data to the controller 102 (step 214).

After the conventional nonvolatile memory 104 writes the data stored in the data register 124 to the memory cell array 122, the data register 124 of the nonvolatile memory 104 cannot keep the data stored therein unchanged. The controller 102 therefore must keep the data stored in the data buffer 114 after the nonvolatile memory 104 writes the data stored in the data register 124 to the memory cell array 122. If a write error occurs during step 212, the controller 102 can then resend the data stored in the data buffer 114 to the data register 124 of the nonvolatile memory 104 to be rewritten to the memory cell array 122.

However, the conventional method 200 for writing data to the nonvolatile memory 104 has shortcomings. First, after the data stored in the data register 124 is written to the memory cell array 122, because the data buffer 114 of the controller 102 has to keep the data stored therein, the controller 102 therefore requires a data buffer 114 with large memory size. Thus, manufacturing cost is increased. In addition, when a write error occurs, the controller 102 resends a write command, a write address, and data to the nonvolatile memory 104. Resending of the write command, the write address, and the data causes delays in the data write process and degrades performances of the memory device 100. A method for managing writing errors for a nonvolatile memory is therefore required to reduce the memory size of the data buffer 114 and reduce the time delay of the data write process, thereby reducing manufacturing cost of the controller 102 and increasing system performance.

BRIEF SUMMARY OF THE INVENTION

The invention provides a nonvolatile memory. In one embodiment, the nonvolatile memory is coupled to a controller, and comprises a data register and a memory cell array. The data register stores data received from the controller, and keeps the data from being changed after the data is written to a memory cell array. The memory cell array writes the data stored in the data register to a first memory space with a first write address sent from the controller.

The invention provides a memory card. In one embodiment, the memory card is coupled to a host, and comprises a controller and a nonvolatile memory. The controller comprises a data buffer for storing data received from the host, sends the data to the nonvolatile memory, and directs the nonvolatile memory to write the data to a first memory space with a first write address. The nonvolatile memory comprises a data register for storing the data received from the controller, writes the data to the first memory space with the first write address, and keeps the data from being changed after the data is written to the first memory space.

The invention provides a method for managing writing errors for a nonvolatile memory. In one embodiment, the nonvolatile memory is coupled to a controller. First, data received from the controller is stored in a data register of the nonvolatile memory. The data stored in the data register is then written to a first memory space with a first write address according to instructions from the controller. The data stored in the data register is kept from being changed after the data is written to the first write address. When an error occurs in writing of the data to the first memory space, a rewrite command is sent from the controller to the nonvolatile memory. After the nonvolatile memory receives the rewrite command, the data stored in the data register is written to a second memory space with a second write address according to the rewrite command.

The invention provides a method for managing writing errors for a nonvolatile memory. In one embodiment, the nonvolatile memory is coupled to a controller. First, data received from the controller is stored in a data register of the nonvolatile memory. The data stored in the data register is then written to a first memory space with a first write address according to instructions from the controller. The data stored in the data register is kept from being changed after the data is written to the first write address. When an error occurs in writing of the data to the first memory space, a read-back command is sent from the controller to the nonvolatile memory. After the nonvolatile memory receives the read-back command, the data stored in the data register is sent back to the controller according to the read-back command.

The invention provides a controller for a nonvolatile memory. In one embodiment, the controller comprises a data buffer and a control unit. The data buffer stores data received from a host. The control unit sends the data stored in the data buffer to a data register of the nonvolatile memory, directs the nonvolatile memory to write the data stored in the data register to a first memory space with a first write address, and sends a rewrite command to the nonvolatile memory to direct the nonvolatile memory to write the data stored in the data register to a second memory space with a second write address when an error occurs in writing of the data to the first memory space. The nonvolatile memory keeps the data stored in the data register from being changed after the data is written to the first write address.

The invention provides a controller for a nonvolatile memory. In one embodiment, the controller comprises a data buffer and a control unit. The data buffer stores data received from a host. The control unit sends the data stored in the data buffer to a data register of the nonvolatile memory, directs the nonvolatile memory to write the data stored in the data register to a first memory space with a first write address, and sends a read-back command to the nonvolatile memory to direct the nonvolatile memory to send the data stored in the data register back to the controller when an error occurs in writing of the data to the first memory space. The nonvolatile memory keeps the data stored in the data register from being changed after the nonvolatile memory writes the data to the first write address.

A detailed description is given in the following embodiments with reference to the accompanying drawings.

BRIEF DESCRIPTION OF THE DRAWINGS

The invention can be more fully understood by reading the subsequent detailed description and examples with references made to the accompanying drawings, wherein:

FIG. 9A is a schematic diagram of comparison between data buffer sizes required by controllers operating according to the methods shown in FIGS. 2, 4, and 6; and FIG. 9B is a schematic diagram of comparison between time periods required by controllers to perform operating rewrite processes according to the methods shown in FIGS. 2, 4, and 6.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 3:
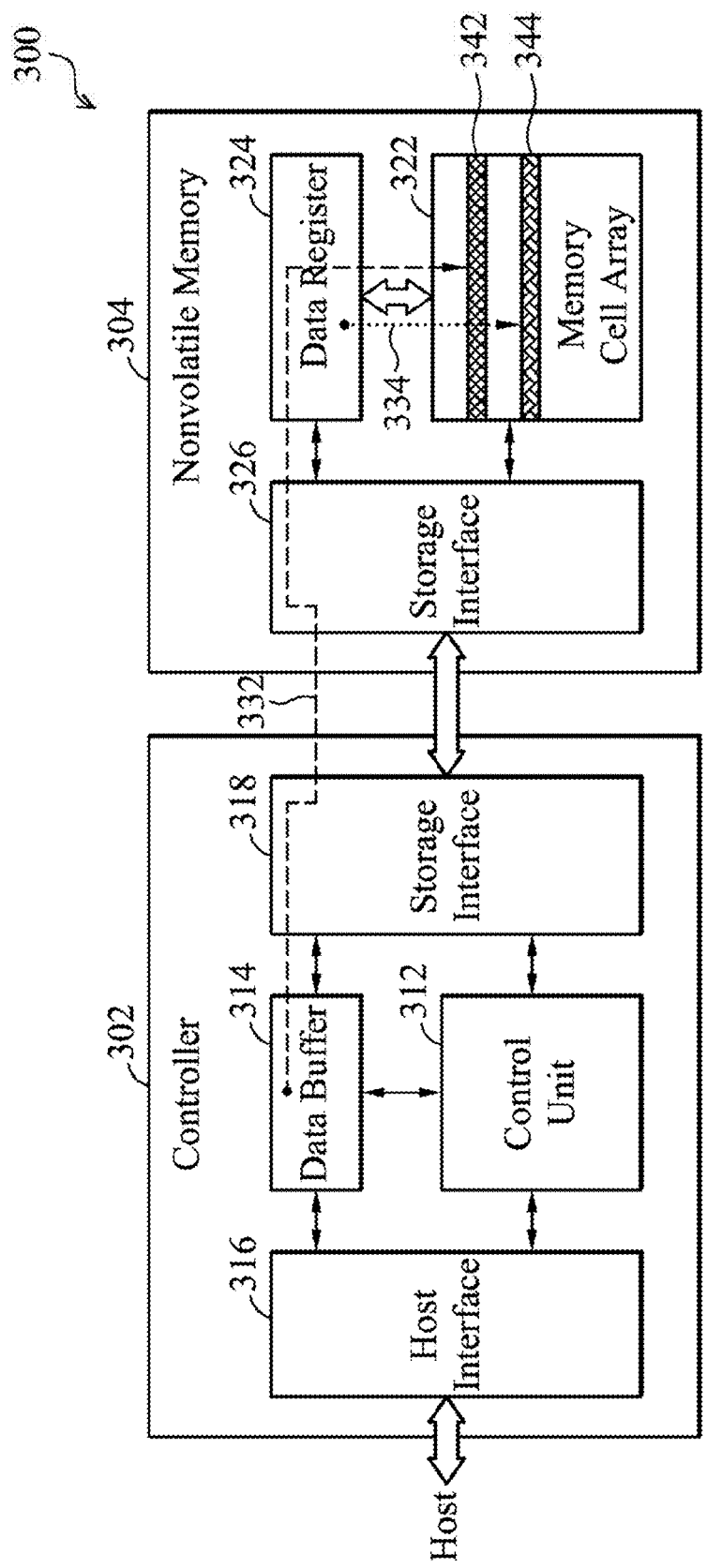
FIG. 3 is a block diagram of a memory device comprising a nonvolatile memory according to the invention.

Referring to FIG. 3, a block diagram of a memory device 300 comprising a nonvolatile memory 304 according to the invention is shown. The memory device 300 comprises a controller 302 and a nonvolatile memory 304. In one embodiment, the memory device 300 is a memory card. In one embodiment, the controller 302 comprises a control unit 312, a data buffer 314, a host interface 316, and a storage interface 318. With the exception of the control unit 312, component circuits of the controller 302 have similar functions with those of corresponding component circuits of the controller 102 shown in FIG. 1. The host interface 316 is for data communications between a host and the controller 302, and the storage interface 318 is for data communications between the controller 302 and the nonvolatile memory 304.

The nonvolatile memory 304 stores data according to instructions from the controller 302. In one embodiment, the nonvolatile memory 304 comprises a storage interface 326, a data register 324, and a memory cell array 322. With the exception of the data register 324, component circuits of the nonvolatile memory 304 have similar functions with those of corresponding component circuits of the nonvolatile memory 104 shown in FIG. 1. The storage interface 326 is for data communications between the controller 302 and the nonvolatile memory 304, and the memory cell array 322 is for data storage. In one embodiment, the nonvolatile memory 304 is a flash memory. Different from the data register 124 shown in FIG. 1, the data register 324 of the nonvolatile memory 304 keeps data stored therein from being changed after the data is written from the data register 324 to the memory cell array 322.

Figure 4:
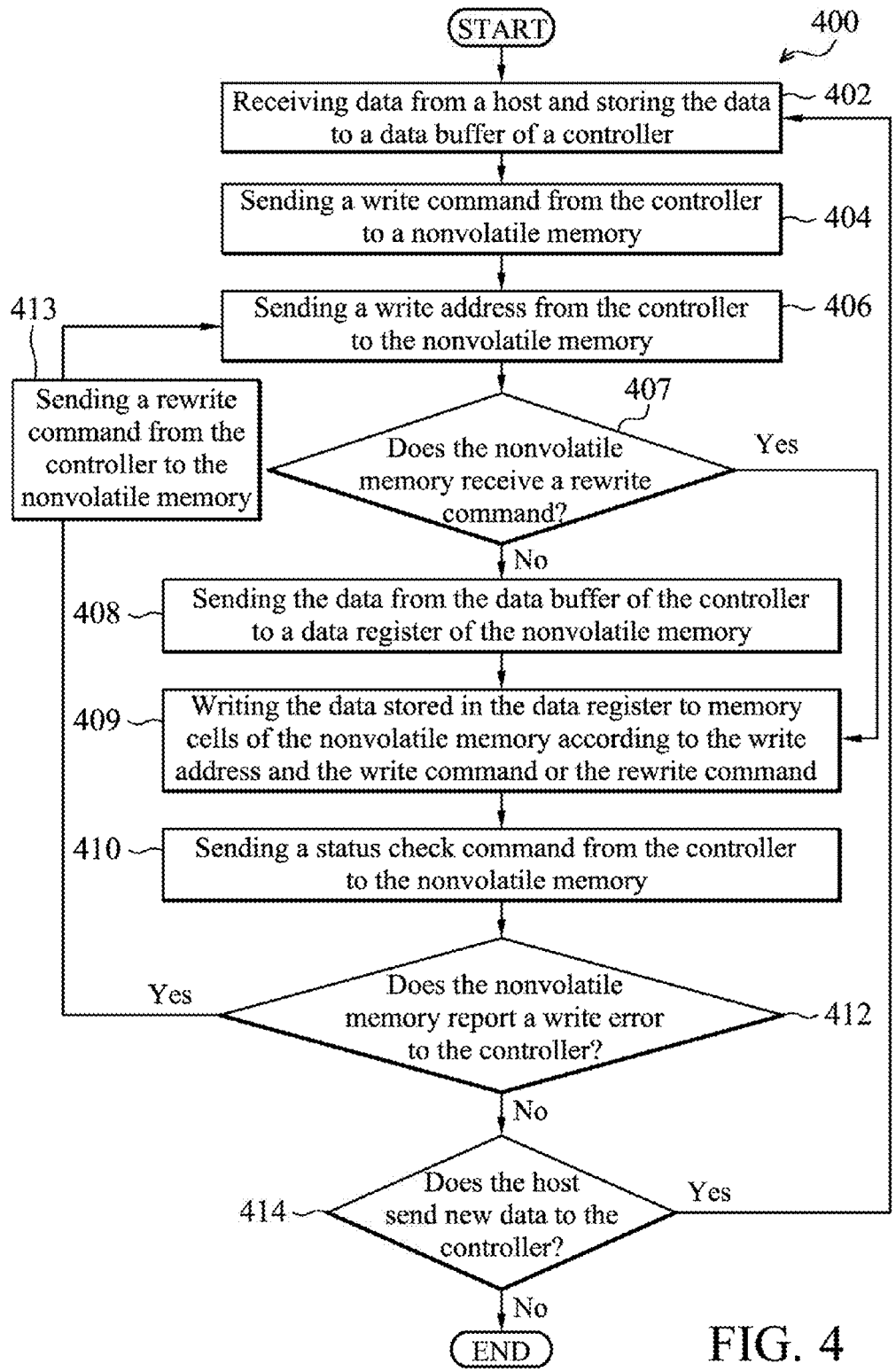
FIG. 4 is a flowchart of a method for writing data to the nonvolatile memory shown in FIG. 3 according to the invention.

When the host requests the controller 302 to write data to the nonvolatile memory 304, the controller 302 performs a data write process according to instructions from the host. Referring to FIG. 4, a flowchart of a method 400 for writing data to the nonvolatile memory 304 shown in FIG. 3 according to the invention is shown. First, the controller 302 receives data from the host via the host interface 316 and stores the data to the data buffer 314 (step 402). The control unit 312 then sends a write command to the nonvolatile memory 304 via the storage interface 318 (step 404). The control unit 312 then sends a write address to the nonvolatile memory 304 via the storage interface 318 (step 406). The control unit 312 then sends the data stored in the data buffer 314 to the nonvolatile memory 304, and the nonvolatile memory 304 then stores the data received from the controller 302 to the data register 324 (step 408).

The nonvolatile memory 304 then writes the data stored in the data register 324 to a memory space of the memory cell array 322 according to the write address and the write command (step 409). The control unit 312 then sends a status check command to the nonvolatile memory 304 (step 410). If an error occurs when the nonvolatile memory 304 writes the data stored in the data register 324 to the memory cell array 322, the nonvolatile memory 304 reports the error to the controller 302. When the nonvolatile memory 304 reports a write error to the controller 302, the controller 302 performs rewrite operations to write the data to the nonvolatile memory 304.

Figure 2:
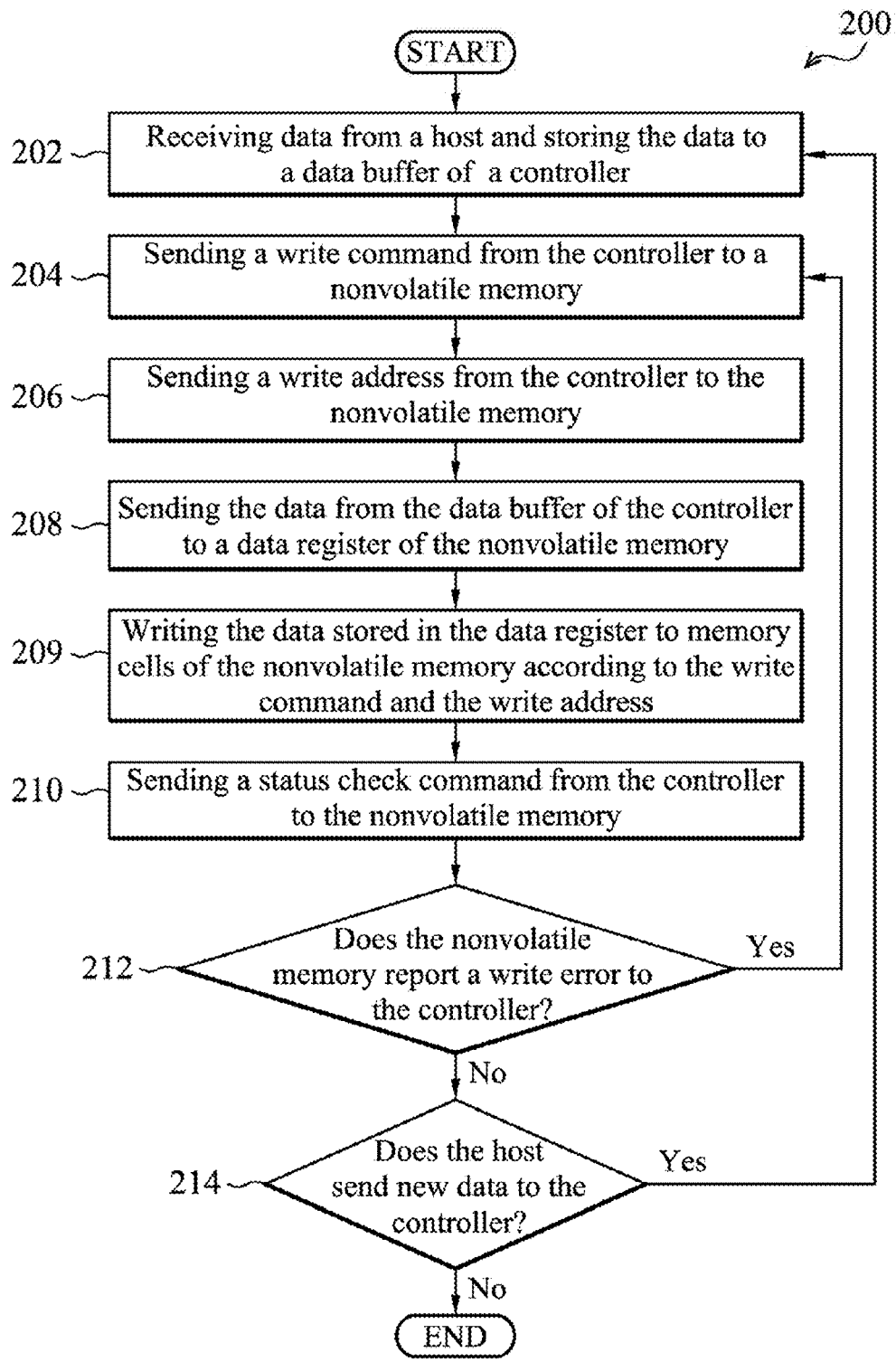
FIG. 2 a flowchart of a conventional method for writing data to the nonvolatile memory shown in FIG. 1.

The rewrite operations performed by the memory device 300 does not resend the write command (step 204), the write address (step 206), and the data (step 208) to the nonvolatile memory 304 as the method 200 shown in FIG. 2. Alternatively, the control unit 312 of the controller 302 sends a rewrite command to the nonvolatile memory 304 (step 413), and then resends a new write address to the nonvolatile memory 304 (step 406). Because the data register 324 of the nonvolatile memory 304 has kept the data stored therein unchanged after the data was written to the memory cell array 322 at step 409, the controller 302 does not need to resend the data stored in the data buffer 314 to the data register 324 of the nonvolatile memory 324 as the step 208 of the method 200. After the nonvolatile memory 304 receives the rewrite command, the nonvolatile memory 304 directly writes the data stored in the data register 324 to a memory space with the new write address in the memory cell array 322 (step 409). The control unit 312 then resends the status check command to the nonvolatile memory 304 (step 410). Writing of the data is completed if the nonvolatile memory 304 does not report a write error to the controller 302 (step 412). The data write process ends if the host does not send new data to the controller 302 (step 414).

Figure 1:
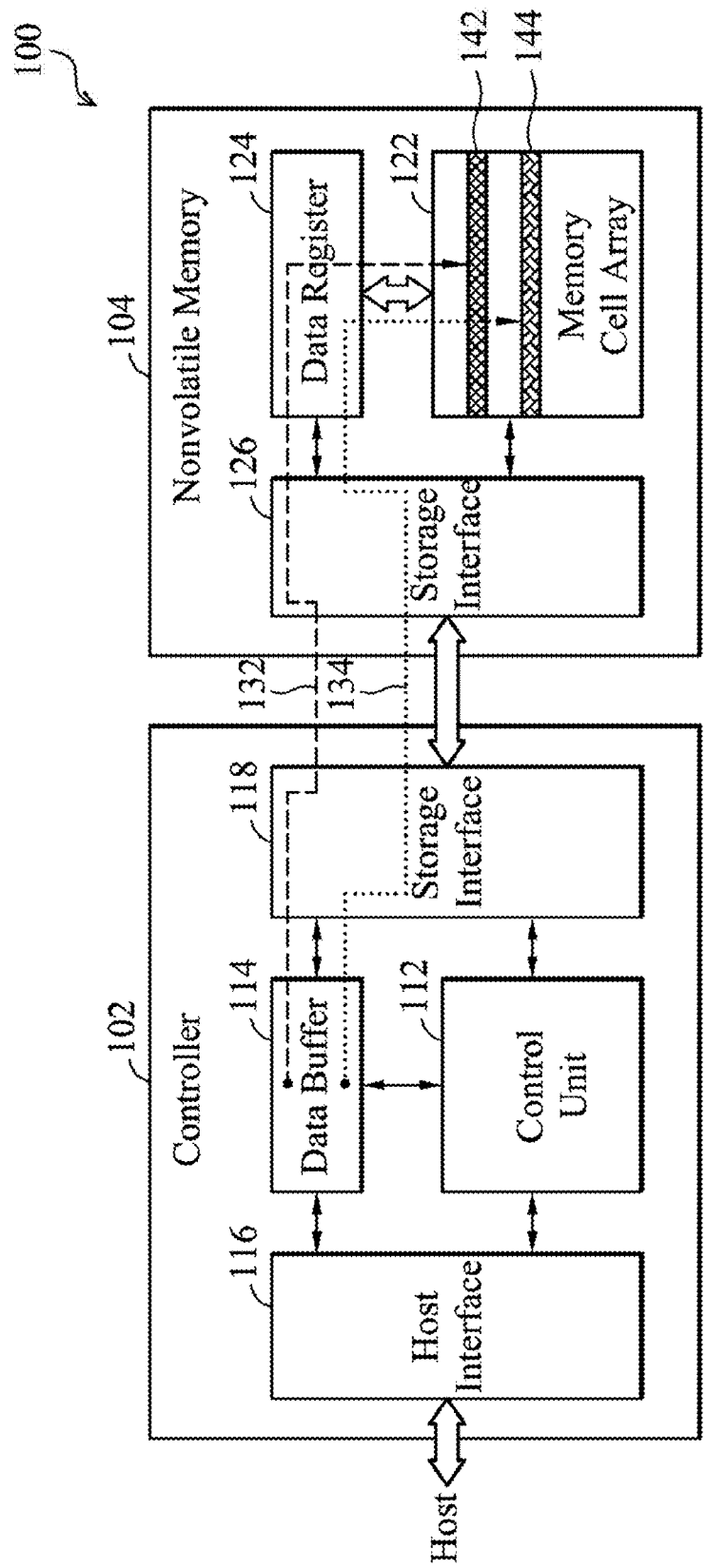
FIG. 1 is a block diagram of a conventional memory device comprising a nonvolatile memory.

In comparison with the memory device 100 shown in FIG. 1, the data register 324 of the nonvolatile memory 304 can keep the data stored therein from being changed after the data is written to the memory cell array 322. The data buffer 314 of the controller 302 therefore does not need to keep a copy of the data, leaving space for new data after the controller 302 sends the data stored in the data buffer 314 to the nonvolatile memory 304. The required memory size of the data buffer 314 is therefore reduced to lower manufacturing cost of the controller 302. In addition, in comparison with the method 200 shown in FIG. 2, when the controller 302 performs a rewrite operation according to the method 400, the controller 302 does not resend the data to the nonvolatile memory 304. In other words, data for a rewrite process according to the method 200 must be transmitted from the data buffer 114 of the controller 102 to the data register 124 of the nonvolatile memory 104 via a data path 134 and is then written to the memory cell array 122. However, data for a rewrite process according to the method 400 is directly written from the data register 324 to the memory cell array 322 via a data path 334. Thus, when a write error occurs, the controller 302 does not need to resend the data from to the nonvolatile memory 304, thus reducing delay period of the data write process, thereby improving the performance of the memory device 300.

Figure 5:
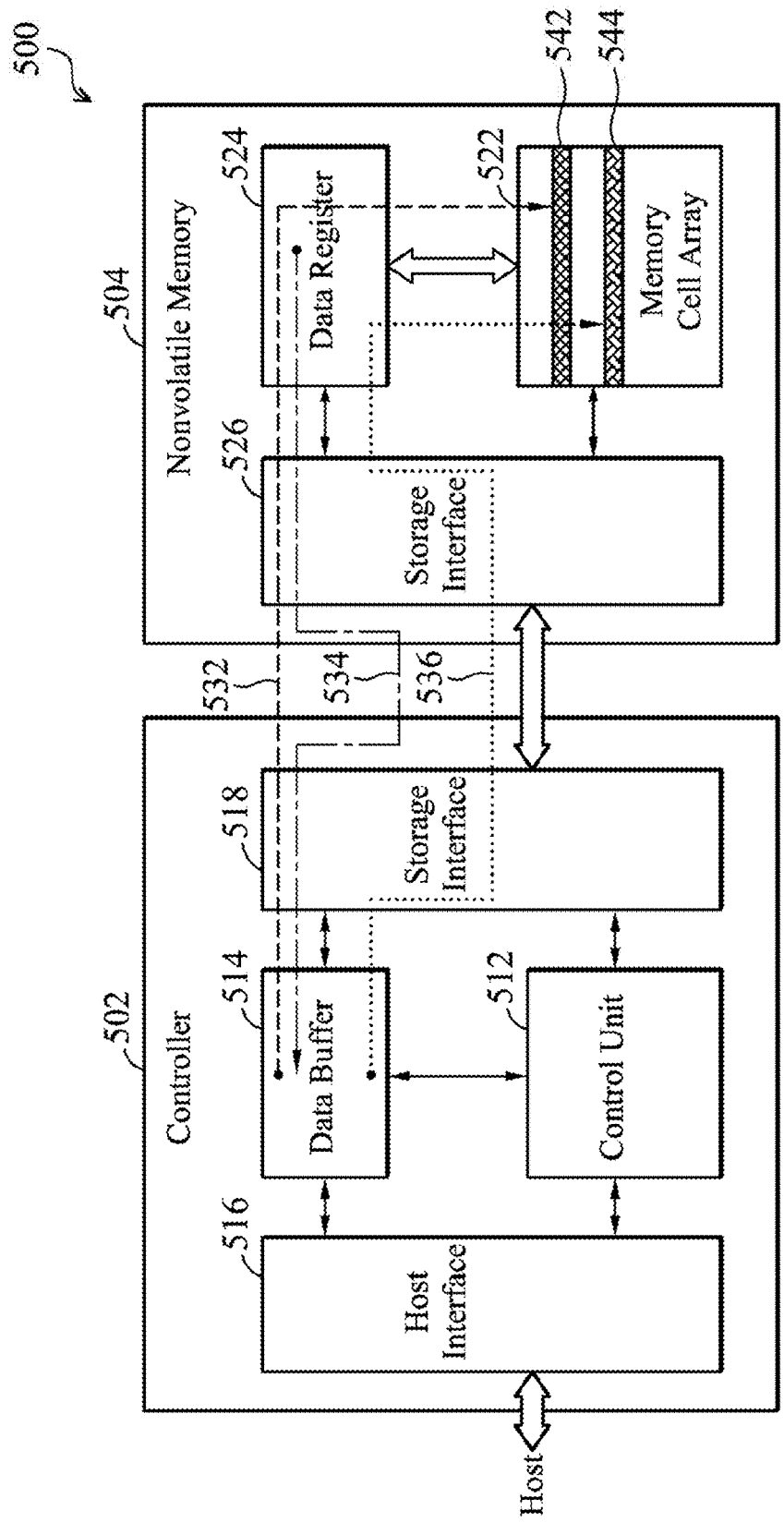
FIG. 5 is a block diagram of a memory device comprising a nonvolatile memory according to the invention.

Referring to FIG. 5, a block diagram of a memory device 500 comprising a nonvolatile memory 504 according to the invention is shown. The memory device 500 comprises a controller 502 and the nonvolatile memory 504. In one embodiment, the memory device 500 is a memory card. In one embodiment, the controller 502 comprises a control unit 512, a data buffer 514, a host interface 516, and a storage interface 518. With the exception of the control unit 512, component circuits of the controller 502 have similar functions with those of corresponding component circuits of the controller 302 shown in FIG. 3. The nonvolatile memory 504 stores data according to instructions from the controller 502. In one embodiment, the nonvolatile memory 304 comprises a storage interface 526, a data register 524, and a memory cell array 522. With the exception of the data register 524, component circuits of the nonvolatile memory 504 have similar functions with those of corresponding component circuits of the nonvolatile memory 304 shown in FIG. 3. In one embodiment, the nonvolatile memory 304 is a flash memory. Different from the data register 124 shown in FIG. 1, the data register 524 of the nonvolatile memory 504 keeps data stored therein from being changed after the data is written from the data register 524 to the memory cell array 522.

Figure 6:
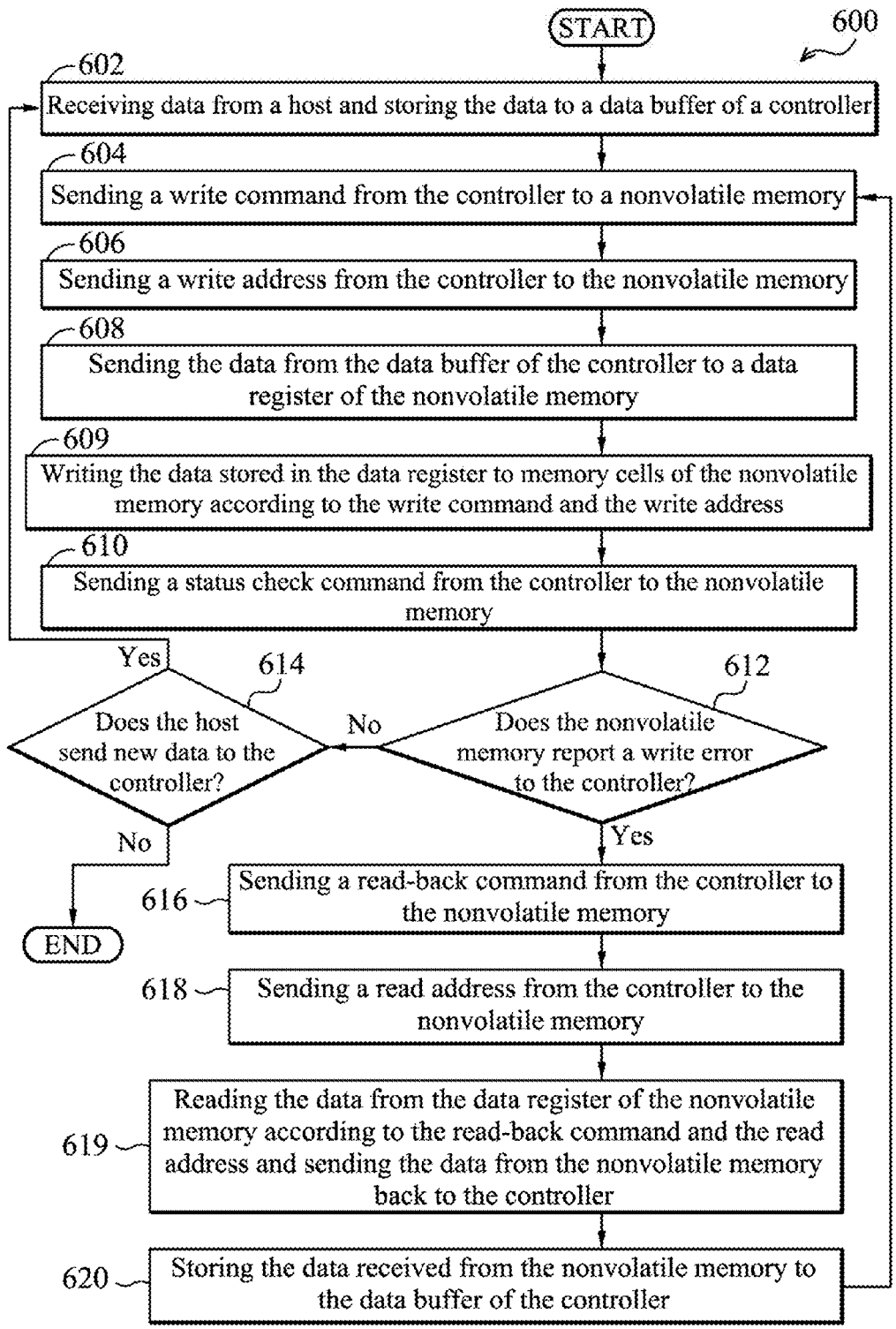
FIG. 6 is a flowchart of a method for writing data to the nonvolatile memory shown in FIG. 5 according to the invention.

When the host requests the controller 502 to write data to the nonvolatile memory 504, the controller 502 performs a data write process according to instructions from the host. Referring to FIG. 6, a flowchart of a method 600 for writing data to the nonvolatile memory 504 shown in FIG. 5 according to the invention is shown. First, the controller 502 receives data from the host via the host interface 516 and stores the data to the data buffer 514 (step 602). The control unit 512 then sends a write command to the nonvolatile memory 504 via the storage interface 518 (step 604). The control unit 512 then sends a write address to the nonvolatile memory 504 via the storage interface 518 (step 606). The control unit 312 then sends the data stored in the data buffer 514 to the nonvolatile memory 504, and the nonvolatile memory 504 then stores the data received from the controller 502 to the data register 524 (step 608).

The nonvolatile memory 504 then writes the data stored in the data register 524 to a memory space of the memory cell array 522 according to the write address and the write command (step 609). The control unit 512 then sends a status check command to the nonvolatile memory 504 (step 610). If an error occurs when the nonvolatile memory 504 writes the data stored in the data register 524 to the memory cell array 522, the nonvolatile memory 504 reports the error to the controller 502 (step 612). When the nonvolatile memory 504 reports a write error to the controller 502, the controller 502 performs rewrite operations to write the data to the nonvolatile memory 504.

To perform the rewrite operations, the control unit 512 of the controller 502 sends a read-back command to the nonvolatile memory 504 (step 616), and then sends a read address to the nonvolatile memory 504 (step 618). Because the data register 524 of the nonvolatile memory 504 keeps the data stored therein unchanged after the data is written to the memory cell array 522 at step 609, the nonvolatile memory 504 is able to read the data stored in the data register 524 according to the read-back command and the read address, and then send the data back to the controller 502 via the storage interface 526 (step 619). After the controller 502 receives the data from the nonvolatile memory 504, the controller 502 stores the data to the data buffer 514 (step 620). The controller 502 then resends a write command (step 604), a new write address (step 606), and the data stored in the data buffer 514 (step 608) to the nonvolatile memory 604 via the storage interface 518. The nonvolatile memory 504 then writes the data to a memory space with the new write address in the memory cell array 522 (step 609). The control unit 512 then resends the status check command to the nonvolatile memory 504 (step 610). Writing of the data is completed if the nonvolatile memory 504 does not report a write error to the controller 502 (step 612). The data write process is ends if the host does not send new data to the controller 502 (step 614).

In comparison with the memory device 100 shown in FIG. 1, the data register 524 of the nonvolatile memory 504 can keep the data stored therein from being changed after the data is written to the memory cell array 522. The data buffer 514 of the controller 502 therefore does not need to keep a copy of the data, leaving the space for new data after the controller 502 sends the data stored in the data buffer 514 to the nonvolatile memory 504. The required memory size of the data buffer 514 is therefore reduced to lower manufacturing cost of the controller 502. In comparison with the method 200 shown in FIG. 2, when the controller 502 performs a rewrite operation according to the method 600, the controller 502 must perform extra steps 616 and 618 to send a read-back command and a read address to the nonvolatile memory 504, and the nonvolatile memory 504 must perform an extra step 619 to send the data stored in the data register 524 back to the controller 502. In other words, data for a rewrite process according to the method 600 must be transmitted from the data register 524 of the nonvolatile memory 504 to the data buffer 514 of the controller 502 via a data path 534, and then transmitted from the data buffer 514 of the controller 502 to the nonvolatile memory 504 via a data path 536 to be written to the memory cell array 522, causing a delay in the rewrite process. Write error, however, rarely occurs, and delay caused by performing the rewrite process does not substantially impact system performance.

Figure 7:
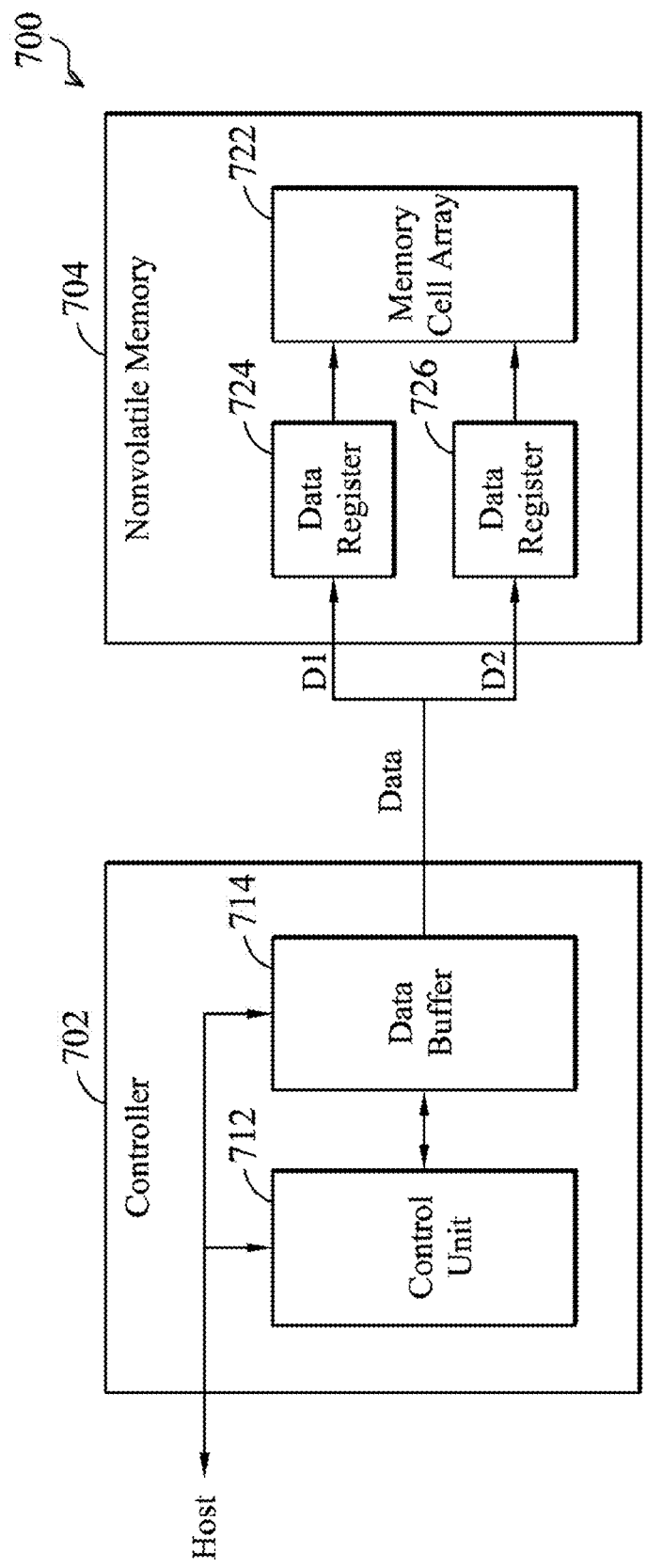
FIG. 7 is a block diagram of a memory card with a 2-plane programming mode according to the invention.
Figure 8:
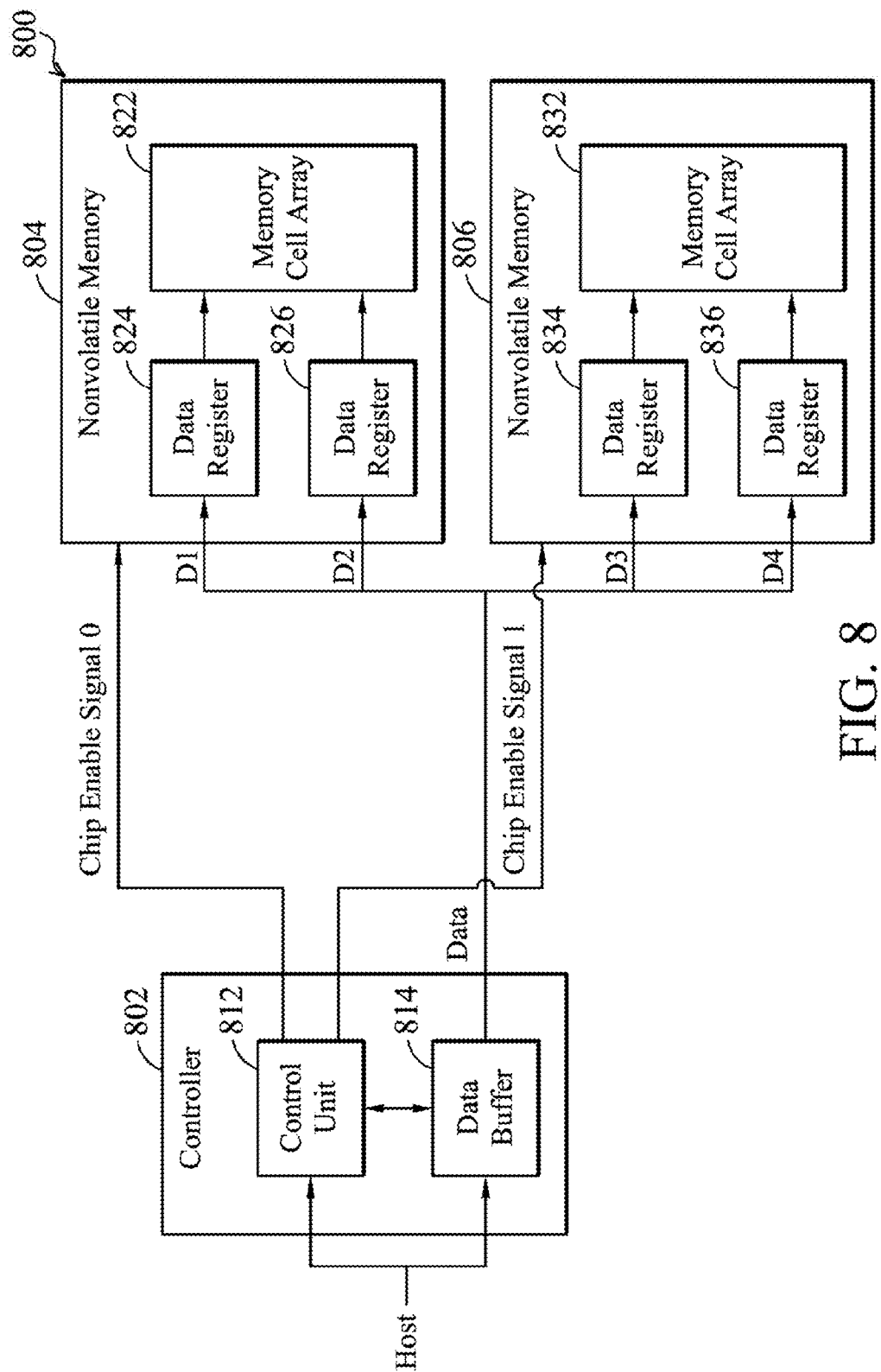
FIG. 8 is a block diagram of a memory card with a 2-plane+ 2-way-interleave programming mode according to the invention.

Referring to FIG. 7, a block diagram of a memory card 700 with a 2-plane programming mode according to the invention is shown. The nonvolatile memory 704 comprises two data registers 724 and 726. Under the 2-plane programming mode, the controller 702 respectively sends data D1 and D2 stored in the data buffer 714 to the two data registers 724 and 726 of the nonvolatile memory 704. When the nonvolatile memory 704 writes the data D1 from the data register 724 to the memory cell array 722, the data register 726 of the nonvolatile memory 704 receives data D2 from the controller 702. When the nonvolatile memory 704 writes the data D2 from the data register 726 to the memory cell array 722, the data register 724 of the nonvolatile memory 704 receives subsequent data D1 from the controller 702. The data registers 724 and 726 therefore alternately receive data from the controller 702. Referring to FIG. 8, a block diagram of a memory card 800 with a 2-plane+2-way-interleave programming mode according to the invention is shown. The memory card 800 comprises two nonvolatile memories 804 and 806, and the controller 802 alternately enables the nonvolatile memories 804 and 806 via the chip enable signals 1 and 2. The nonvolatile memory 804 comprises two data registers 824 and 826, and the nonvolatile memory 806 comprises two data registers 834 and 836. When the nonvolatile memory 804 is enabled, the two data registers 824 and 826 of the nonvolatile memory 804 alternately receive data D1 and D2 from the controller 802. When the nonvolatile memory 806 is enabled, the two data registers 834 and 836 of the nonvolatile memory 806 alternately receive data D3 and D4 from the controller 802.

Referring to FIG. 9A, a schematic diagram of comparison between data buffer sizes required by controllers 102, 302, and 502 operating according to the methods 200, 400, and 600 shown in FIGS. 2, 4, and 6 is shown. Assume that controllers 102, 302, and 502 write data of a page to corresponding nonvolatile memories 104, 304, and 504 in each write command. According to the conventional method 200, the data buffer of the controller 102 has a required data buffer size of 1 page under a basic programming mode, has a required data buffer size of 2 pages under a 2-plane programming mode, has a required data buffer size of 4 pages under a 2-way-interleave programming mode, and has a required data buffer size of 8 pages under a 2-plane+2-way-interleave programming mode. On the contrary, the nonvolatile memories 304 and 504 can keep data stored in the data registers 324 and 524 unchanged, and the data buffers 314 and 514 do not need to keep the data stored therein after the data is sent from the controllers 302 and 502 to the nonvolatile memories 304 and 504. The data buffers 314 and 514 of the controllers 302 and 502 therefore only have a required buffer size of a page under all programming modes, thus reducing manufacturing costs of the controllers 302 and 502.

Referring to FIG. 9B, a schematic diagram of comparison between time periods required by controllers 102, 302, and 502 to perform operating rewrite processes according to the methods 200, 400, and 600 shown in FIGS. 2, 4, and 6 is shown. According to the conventional method 200, a rewrite process comprises the steps 204, 206, 208, and 210 to respectively send a write command, a new write address, data, and a status check command to the nonvolatile memory 104. If transmission of the write command, the new write address, the data, and the status check command require 2, X, N, and 1 clock cycle, the rewrite process according to the conventional method 200 requires (X+3+N) clock cycles in total. According to the method 400 shown in FIG. 4, a rewrite process comprises the steps 404, 406, and 410 to respectively send a rewrite command, a new write address, and a status check command to the nonvolatile memory 304. If transmission of the rewrite command, the new write address, and the status check command require 2, X, and 1 clock cycle, the rewrite process according to the method 400 only requires (X+3) clock cycles in total, thus improving system performance. According to the method 600, a rewrite process comprises the steps 616, 618, 619, 604, 606, 608, and 610 to respectively transmit a read-back command, a read address, read-back data, a write command, a new write address, data, and a status check command. The rewrite process according to the conventional method 600 thus requires [(X+3+N)×2] clock cycles in total.

While the invention has been described by way of example and in terms of preferred embodiment, it is to be understood that the invention is not limited thereto. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:
1. A nonvolatile memory, coupled to a controller, comprising:
   a data register, storing data received from the controller, and keeping the data from being changed after the data is written to a memory cell array; and a memory cell array, coupled to the data register, writing the data stored in the data register to a first memory space with a first write address sent from the controller;

wherein if an error occurs when the memory cell array writes the data to the first memory space, the nonvolatile memory reports the error to the controller, the controller then sends a read-back command to the nonvolatile memory, and the nonvolatile memory then sends the data stored in the data register back to the controller according to the read-back command.

2. The nonvolatile memory as claimed in claim 1, wherein after the nonvolatile memory reports the error to the controller, the controller sends a rewrite command to the nonvolatile memory without resending the data to the nonvolatile memory, and the nonvolatile memory then writes the data stored in the data register to a second memory space with a second write address according to the rewrite command.

3. The nonvolatile memory as claimed in claim 1, wherein after the controller receives the data from the nonvolatile memory, the controller resends the data to the nonvolatile memory, and the nonvolatile memory then writes the data to a second memory space with a second write address sent from the controller.

4. A memory card, coupled to a host, comprising:

a controller, comprising a data buffer for storing data received from the host, sending the data to a nonvolatile memory, and directing the nonvolatile memory to write the data to a first memory space with a first write address; and the nonvolatile memory, comprising a data register for storing the data received from the controller, writing the data to the first memory space with the first write address, and keeping the data from being changed after the data is written to the first memory space;

wherein if an error occurs when the nonvolatile memory writes the data to the first memory space, the nonvolatile memory reports the error to the controller, the controller then sends a read-back command to the nonvolatile memory, and the nonvolatile memory then sends the data stored in the data register back to the controller according to the read-back command.

5. The memory card as claimed in claim 4, wherein after the nonvolatile memory reports the error to the controller, the controller sends a rewrite command to the nonvolatile memory without resending the data to the nonvolatile memory, and the nonvolatile memory then writes the data stored in the data register to a second memory space with a second write address according to the rewrite command.

6. The memory card as claimed in claim 4, wherein after the controller receives the data from the nonvolatile memory, the controller resends the data to the nonvolatile memory, and the nonvolatile memory then writes the data to a second memory space with a second write address sent from the controller.

7. A method for managing writing errors for a nonvolatile memory, wherein the nonvolatile memory is coupled to a controller, comprising:

storing data received from the controller in a data register of the nonvolatile memory;

writing the data stored in the data register to a first memory space with a first write address according to instructions from the controller;

keeping the data stored in the data register from being changed after the data is written to the first write address;

when an error occurs in writing of the data to the first memory space, sending a read-back command from the controller to the nonvolatile memory; and after the nonvolatile memory receives the read-back command, sending the data stored in the data register back to the controller according to the read-back command.

8. The method as claimed in claim 7, wherein the method further comprises:

after the controller receives the data from the nonvolatile memory, sending the data again from the controller to the nonvolatile memory; and after the nonvolatile memory receives the data, writing the data to a second memory space with a second write address sent from the controller.

9. A controller for a nonvolatile memory, comprising:

a data buffer, storing data received from a host; and a control unit, sending the data stored in the data buffer to a data register of the nonvolatile memory, directing the nonvolatile memory to write the data stored in the data register to a first memory space with a first write address, and sending a read-back command to the nonvolatile memory to direct the nonvolatile memory to send the data stored in the data register back to the controller when an error occurs in writing of the data to the first memory space, wherein the nonvolatile memory keeps the data stored in the data register from being changed after the nonvolatile memory writes the data to the first write address.

10. The controller as claimed in claim 9, wherein the control unit resends the data to the nonvolatile memory after the controller receives the data from the nonvolatile memory, and the nonvolatile memory writes the data to a second memory space with a second write address after the nonvolatile memory receives the data.

* * * * *